(12) United States Patent
Jinbo et al.

(10) Patent No.: US 6,507,031 B1
(45) Date of Patent: Jan. 14, 2003

(54) APPARATUS AND METHOD OF IRRADIATING ULTRAVIOLET LIGHT

(75) Inventors: Yosuke Jinbo, Tokyo (JP); Norio Kobayashi, Tokyo (JP)

(73) Assignee: Hoya-Schott Corporation, Tokyo (JP)

( * ) Notice: Subject to any disclaimer, the term of this patent is extended or adjusted under 35 U.S.C. 154(b) by 25 days.

(21) Appl. No.: 09/692,419

(22) Filed: Oct. 20, 2000

(30) Foreign Application Priority Data

Oct. 20, 1999 (JP) .......................................... 11-298911

(51) Int. Cl.[7] .................................................. C23C 8/12
(52) U.S. Cl. .............................. 250/455.11; 250/492.1; 134/1
(58) Field of Search ........................ 250/455.11, 492.2, 250/492.1; 134/1

(56) References Cited

U.S. PATENT DOCUMENTS 3,769,517 A * 10/1973 Coleman ............... 250/455.11
5,510,158 A * 4/1996 Hiramoto et al. ........... 427/582

OTHER PUBLICATIONS

Ruzyllo et al., "Preoxidation UV Treatment of Silicon Wafers", Journal of the Electrochemical Society, vol. 134, No. 8, pp. 2052–2055.*

* cited by examiner

*Primary Examiner*—Jack Berman
(74) *Attorney, Agent, or Firm*—Nixon & Vanderhye P.C.

(57) ABSTRACT

An ultraviolet light beam irradiating apparatus of the present invention has a bed for supporting a work in atmosphere, an ultraviolet light irradiation light source for irradiating the surface of the work with an ultraviolet light beam having a wavelength of 175 nm or shorter, and inert gas inflow structure for allowing an inert gas, preferably nitrogen, helium or argon, into a space in the atmosphere above the work surface of the work. The inert gas is allowed to flow into the space, whereby the oxygen concentration between the ultraviolet light irradiation light source and the work surface is decreased, so that the absorption of the ultraviolet light beam is decreased.

20 Claims, 9 Drawing Sheets

[Fig. 1]
(A)
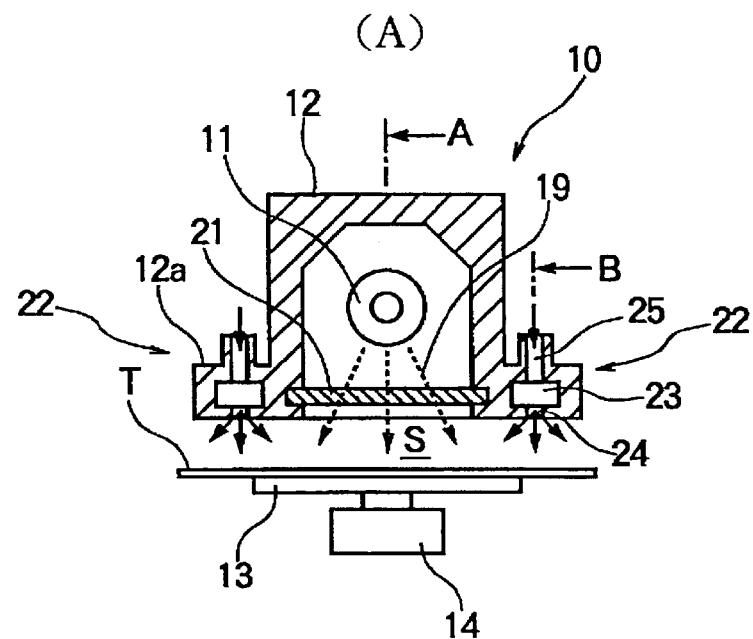
(B)
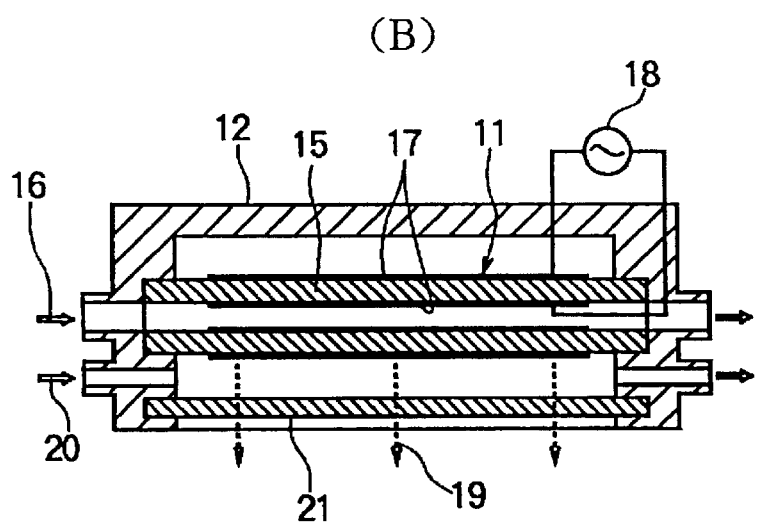
(C)
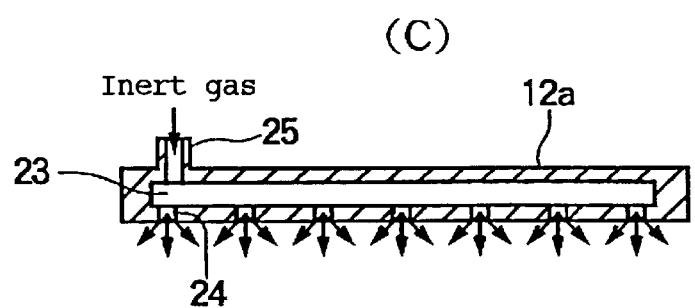

[Fig. 2]
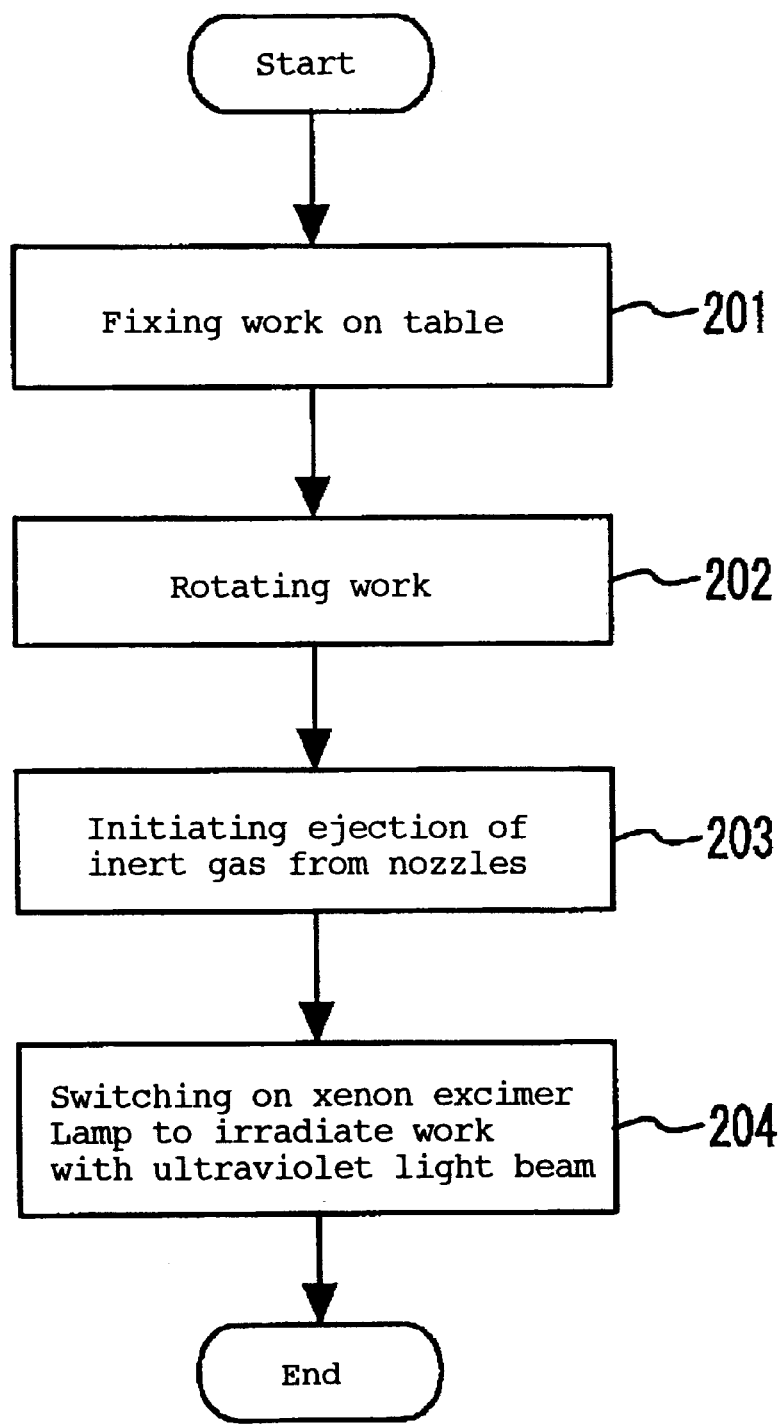

[Fig. 3]
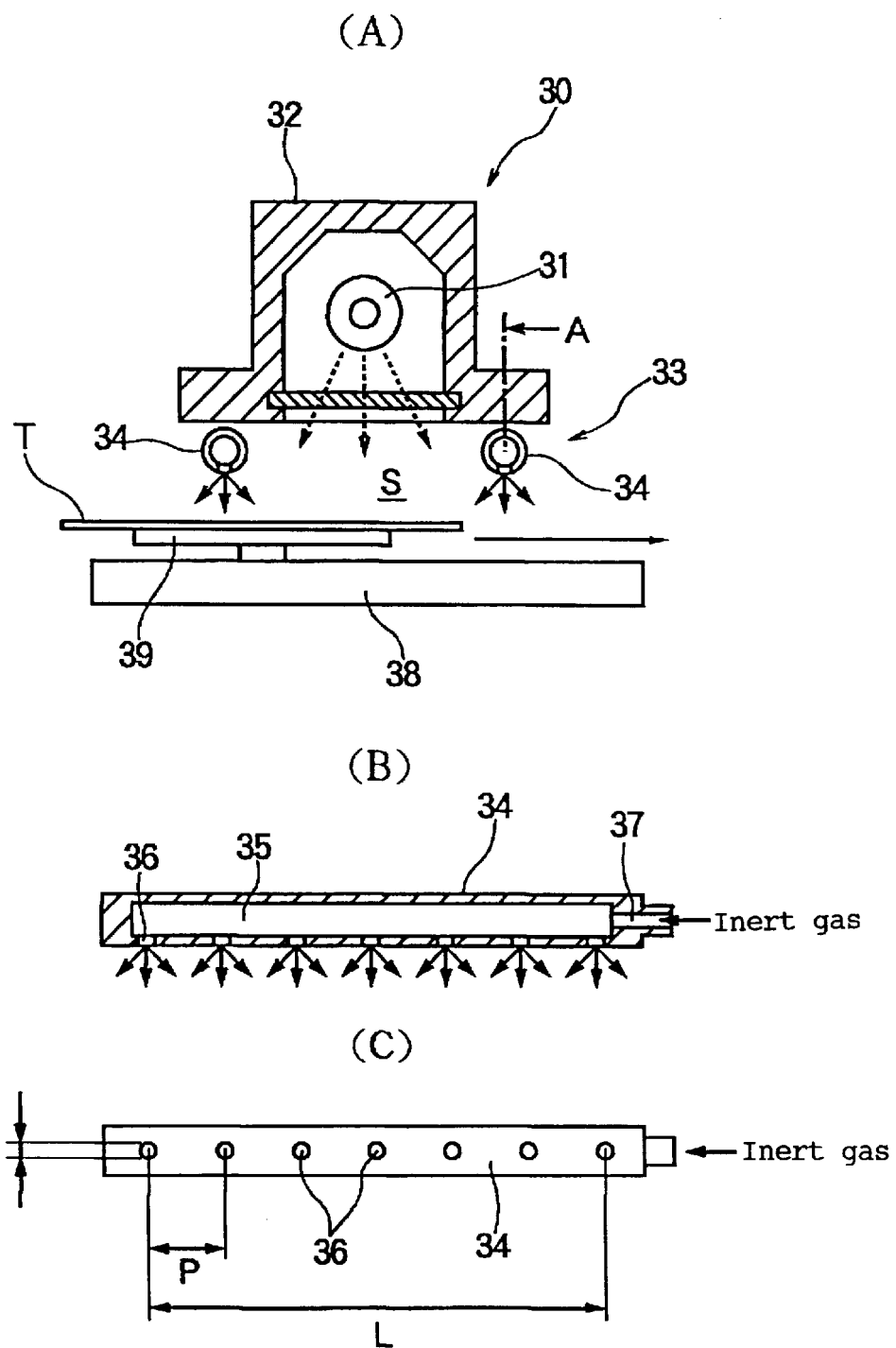

[Fig. 4]
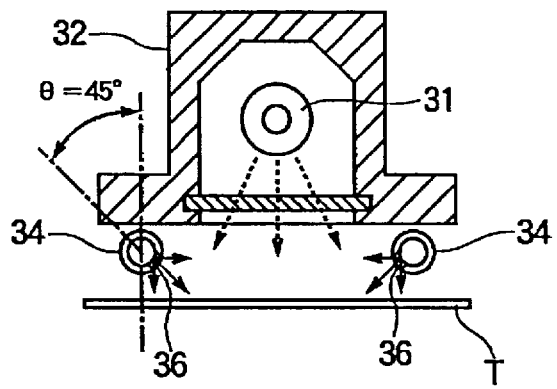
(A)
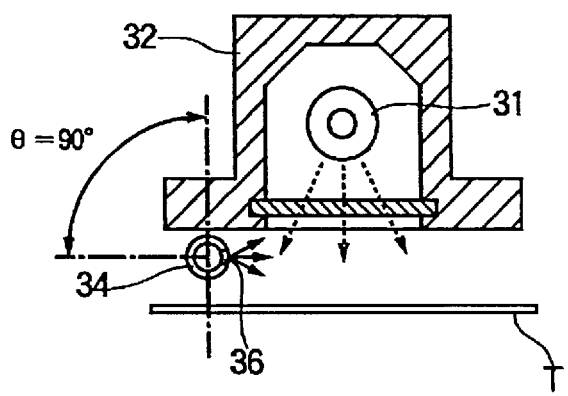
(B)
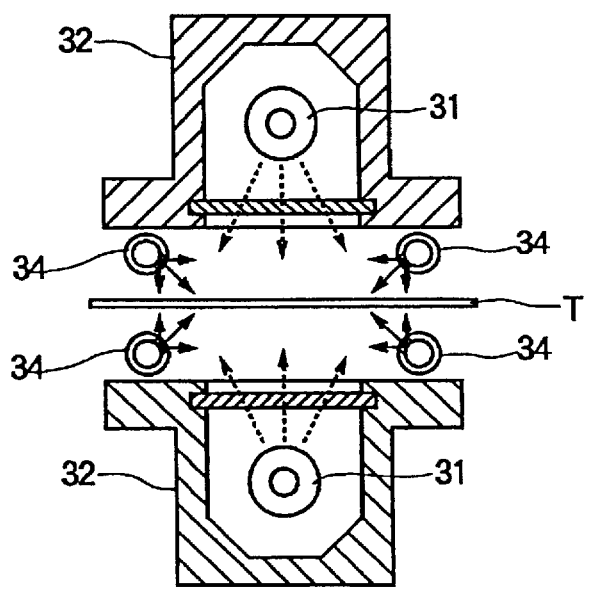
(C)

[Fig. 5]
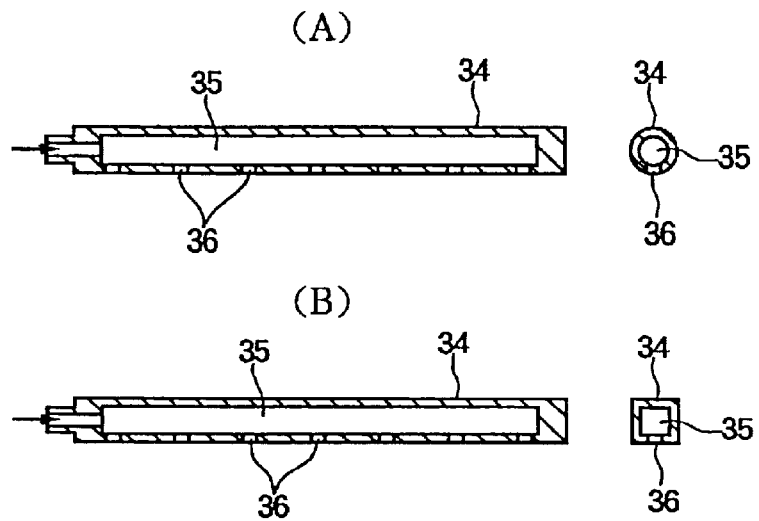
[Fig. 6]
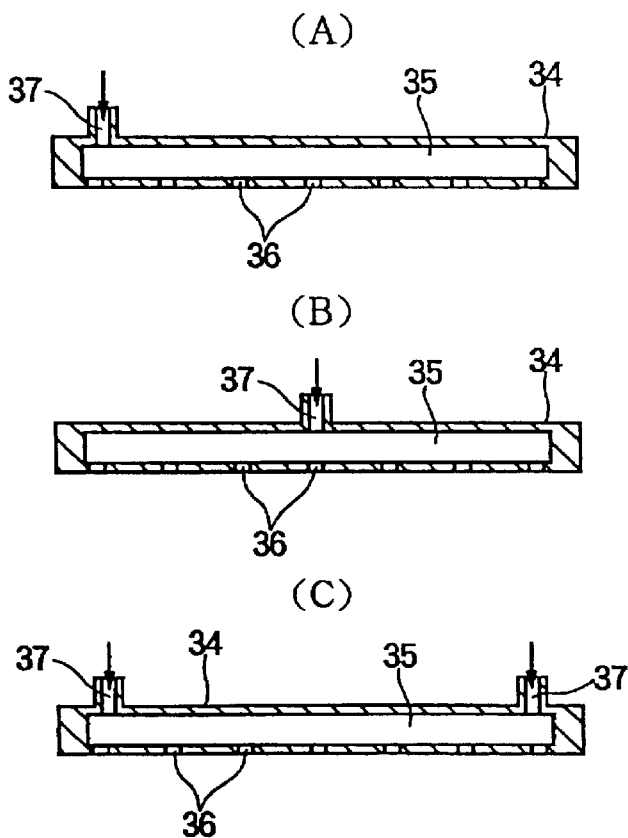

[Fig. 7]
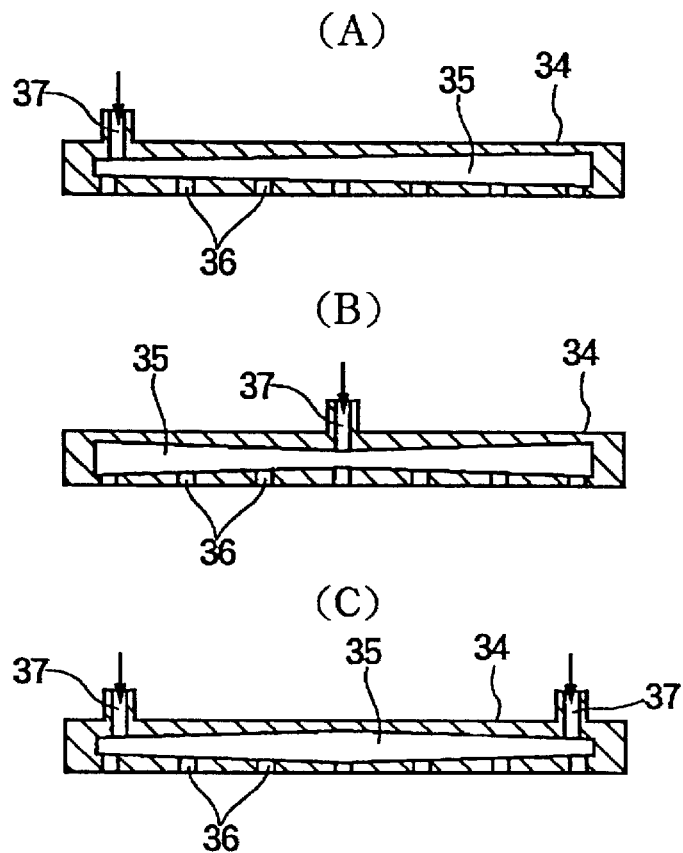
[Fig. 8]
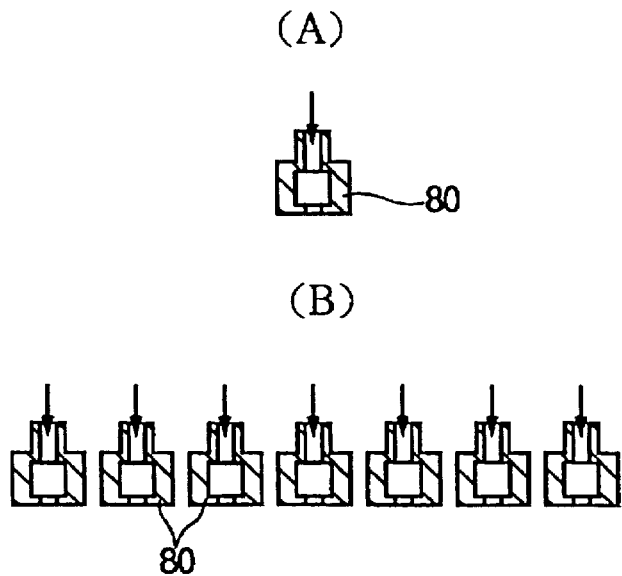

[Fig. 9]
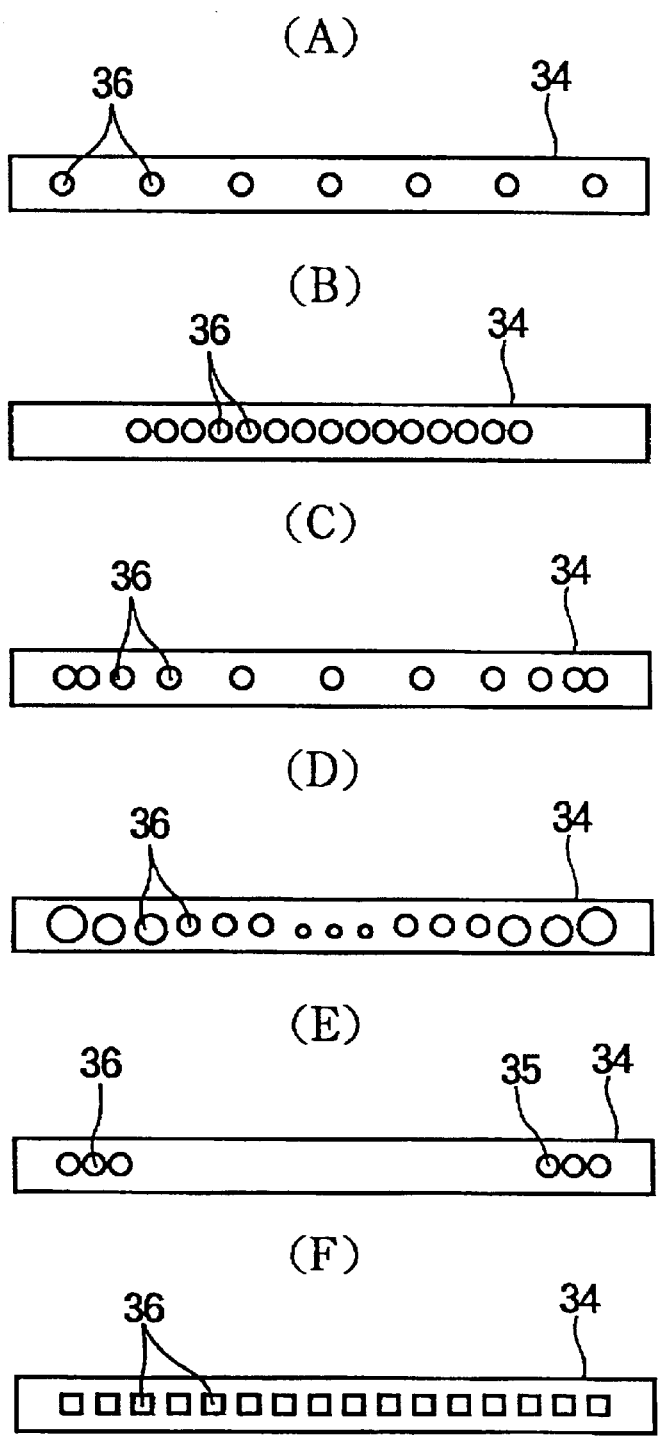

[Fig. 10]
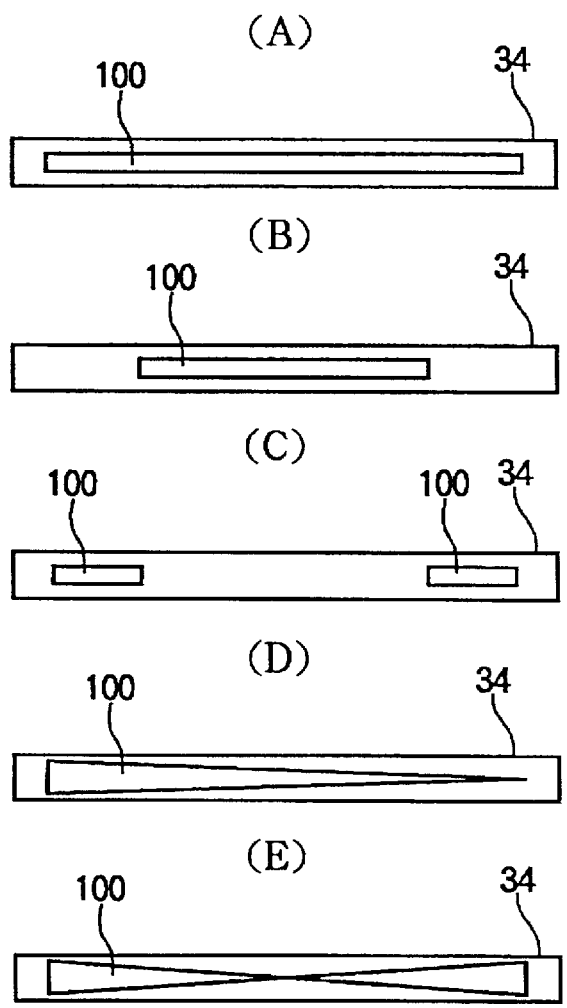
[Fig. 11]
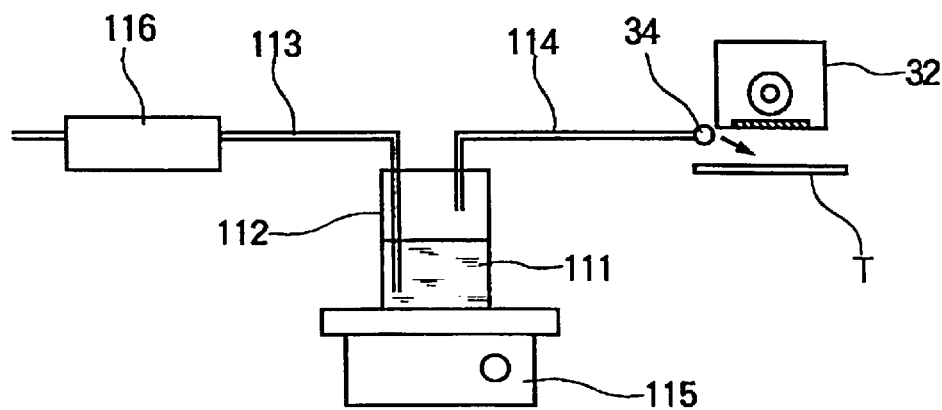

[Fig. 12]
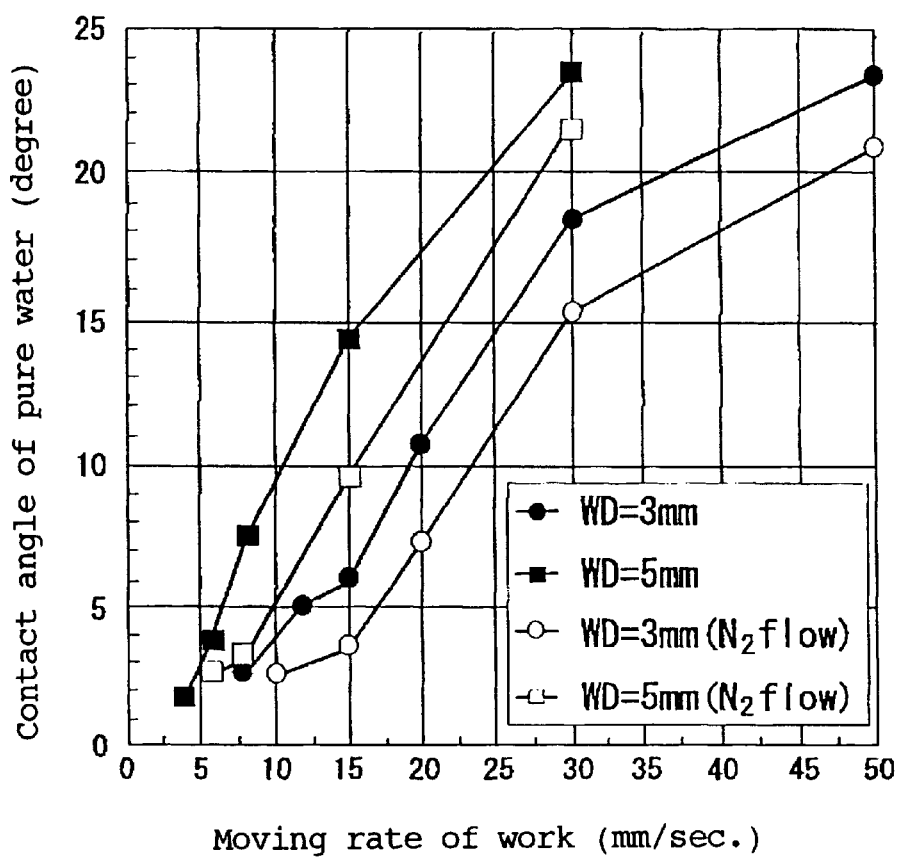

APPARATUS AND METHOD OF IRRADIATING ULTRAVIOLET LIGHT

DETAILED DESCRIPTION OF THE INVENTION

1. Field of the Invention

The present invention relates to an ultraviolet light beam irradiating apparatus and method for irradiating the surface of a work such as a semiconductor silicon wafer or a substrate for producing a liquid crystal display, with an ultraviolet light beam to treat the surface, i.e., to oxidize and remove an organic material adhering to the surface, to directly oxidize the surface or to modify the surface.

2. Prior Art

A cleaning method using irradiation with an ultraviolet light beam is studied or used for/in part of the cleaning step in the production of a semiconductor integrated circuit or a liquid crystal display. The mainstream of the method is a method using a low-pressure mercury lamp as a light source. The low-pressure mercury lamp is a discharge lamp having spectra mainly in wavelengths of 186 nm and 254 nm.

When an oxygen-existing atmosphere such as air is irradiated with a low-pressure mercury lamp, oxygen molecules are dissociated to oxygen atoms $O(^3P)$.

$$O_2 + h\nu(\lambda=175-254\ nm) \rightarrow O(^3P) + O(^3P)$$

The oxygen atom $O(^3P)$ generated above bonds to an ambient oxygen molecule which is not yet dissociated, to generate ozone ($O_3$).

$$O(^3P) + O_2 \rightarrow O_3$$

Ozone mainly absorbs light at and around a wavelength of 254 nm and has an absorption band in the wavelength of 220 to 300 nm. Therefore, $O_3$ exposed to a light having a wavelength of 254 nm from a low-pressure mercury lamp absorbs the light and dissociated into an exited-state oxygen atom $O(^1D)$ and an oxygen molecule ($O_2$).

$$O_3 + h\nu(\lambda=220-300\ nm) \rightarrow O(^1D) + O_2$$

While a light at 186 nm has a photon energy of 6.7 eV, typical organic substances have a C—H bond energy of 3.5 eV and a C—O bond energy of 3.3 eV which are lower than the photon energy of a light at 186 nm. When an organic compound is irradiated with the above light, therefore, chemical bonds are broken, and further, the organic compound is dissipated and removed by the oxidation strength of ozone and active oxygen species generated by the above processes. When the above method is applied to a clean surface where no organic substances are present, a hydrophilic group such as an OH group or the like is introduced into the surface to render the surface of a work hydrophilic. This procedure is employed before the formation of a film for improving the adhesion of the film.

Meanwhile, for a more efficient method, a cleaning or modification method using an excimer lamp with xenon capable of radiating a light having a shorter wavelength sealed therein has been and is recently studied in place of a low-pressure mercury lamp.

In the excimer lamp, AC high voltage of several kV is applied to a quartz glass tube with xenon gas sealed therein to cause a barrier discharge, and xenon gas molecules are brought into a state of excited bonds, that is, an excimer (excimer state) and a light is emitted during a process from the above state back to their ground state, and the above method uses such a light. In a lamp with xenon gas sealed therein, a radiated light has a wavelength of 172 nm (half-width 14 nm).

The photon energy at 172 nm is 7.2 eV or higher than 6.7 eV of a low-pressure mercury lamp, and the chemical bonds are broken more effectively. Since a radiated light from a xenon excimer lamp contains almost no light at 220 to 300 nm, it neither can decompose ozone nor can generate active oxygen in an excited state. However, when oxygen molecules $O_2$ are irradiated with a light having a wavelength shorter than 175 nm, excited-state oxygen molecules $O(^1D)$ can be directly generated.

$$O_2 + h\nu(-175\ nm) \rightarrow O(^1D) + O(^3P)$$

As described above, the method using the xenon excimer lamp has many advantages over the method using a low-pressure mercury lamp in that the photon energy is high; excited-state oxygen atoms having high oxidation strength can be directly generated; a light radiated from the xenon excimer lamp has a quasi-single wavelength at 172 nm while light radiated from a low-pressure mercury lamp has spectrum at 186 nm, 254 nm, etc., and the efficiency of taking out (conversion to) vacuum ultraviolet light having a wave length of 200 nm or shorter on the basis of inputted energy (consumption power) is high.

Therefore, the actual cleaning efficiency is also high. The above cleaning or oxidation method using irradiation with ultraviolet light is called a $UV/O_3$ treatment, and the $UV/O_3$ treatment is generally carried out on a work placed in atmosphere. Generally, the efficiency of the $UV/O_3$ treatment increases with an increase in the intensity of UV light with which a work is irradiated, and it also increases with an increase in the concentration of ozone in a treatment atmosphere. In the method using a low-pressure mercury lamp in particular, irradiation at 186 nm is essential for generating ozone. However, light irradiated from a low-pressure mercury lamp has a far higher intensity at 254 nm than it has at 186 nm, and the concentration of ozone generated is not so high. For this reason, it is actual practice to externally introduce ozone generated with an ozone generator into the treatment atmosphere.

In integrated-circuit production process in which a throughput is considered essential, it is considered essential to decrease the length of a processing time, and studies are being made for a method that serves to shorten the $UV/O_3$ treatment time. The most general method is a method of rising the temperature of a substrate. "Theory and Practice of Ozone Utilization" (Realize K. K., issued in 1989, page 309, ISBN:4-947665-29-1) shows influences of the temperature of a work on the efficiency of the $UV/O_3$ treatment. According thereto, when the temperature of a work is 100° C., the rate of removal of organic substances is approximately 5 times higher than the rate at 30° C.

Further, "Preoxidation UV Treatment of Silicon Wafers" (J. Electrochem. Soc, Vol. 134, No.8, 1987, P. 2052, co-written by J. Ruzyllo, G. T. Duranko and A. M. Hoff) describes a method of increasing an oxidation rate by adding water vapor to a treatment atmosphere in the $UV/O_3$ treatment using a low-pressure mercury lamp. It is shown that, in the above method, the oxidation rate is increased by introducing oxygen gas into a bottle containing pure water warmed at 65° C. to generate water vapor and adding the water vapor to a treatment atmosphere.

While methods for increasing the oxidation rate are studied in various ways as described above, it is commercially desired to develop an ultraviolet light beam irradiating apparatus and method which can achieve the treatment for a shorter period of time.

It is an object of the present invention to provide an ultraviolet light beam irradiating apparatus and method for irradiating the surface of a work with an ultraviolet light beam to treat the surface, according to which the efficiency of the treatment is improved and the length of the treatment time period is shortened.

It is another object of the present invention to achieve the above object with a relatively simple apparatus constitution.

Gist of the Invention

SUMMARY OF THE INVENTION

The ultraviolet light beam irradiating apparatus for irradiating the surface of a work with an ultraviolet light beam to treat the work surface, provided by the present invention, comprises a bed for supporting the work in atmosphere, an ultraviolet light beam source for irradiating the surface of the work with a vacuum ultraviolet light beam having a wavelength of 175 nm or shorter, and inert gas inflow structure for allowing an inert gas, preferably one of nitrogen, helium and argon to flow into a space of the atmosphere on and above the surface of the work.

The above treatment of the work surface includes oxidation and removal of organic substances adhering to the surface, direct oxidation of the surface and modification of the surface.

In the above case, preferably, the above inert gas is mixed with water vapor and the mixture is allowed to flow into the above space.

As shown in the above "Theory and Practice of Ozone Utilization", oxygen intensely absorbs light having a wavelength of 130 to 175 nm, and an oxygen molecule which has absorbed the light is dissociated directly into an oxygen atom $O(^3P)$ in a ground state and oxygen atom $O(^1D)$ in an excited state. That is $$O_2 + h\nu(130-175\ nm) \rightarrow O(^1D) + O(^3P).$$

The excited oxygen atom $O(^1D)$ generated by the above reaction has higher oxidation power than ozone $O_3$ and serves to carry out cleaning, modification and oxidation efficiently. In the $UV/O_3$ treatment, it is essential to irradiate the work surface with an ultraviolet light beam, since the $UV/O_3$ treatment is based on synergistic effects of oxidation caused by active oxygen species such as $O_3$ and oxygen atoms in an excited state and decomposition of compounds caused by irradiation with an ultraviolet light beam from the light source.

Since, however, oxygen molecules absorb intensely ultraviolet light, the intensity of an ultraviolet light beam decreases with an increase in the distance from the ultraviolet light source. Preferably, therefore, the distance between the ultraviolet light source and the work is as small as possible. In the ultraviolet light beam irradiating apparatus, it is structurally required to provide a certain gap (practically 3 to 5 mm) between the ultraviolet light source and the work.

According to the present invention, an inert gas flows into the above space, whereby the oxygen concentration between the ultraviolet light source and the work surface is decreased, so that the absorption of an ultraviolet light beam is therefore decreased.

Further, an inert gas is mixed with water vapor, and the mixture flows into the above space, whereby $OH^-$ having high oxidation power is generated, so that the effect of $UV/O_3$ treatment is further improved. That is, when irradiated with an ultraviolet light beam, water vapor $H_2O$ generates $H^+$ and $OH^-$ according to the following equation.

$$H_2O + h\nu \rightarrow H^+ + OH^-$$

$OH^-$ has oxidation power four times as strong as that of $O_3$ and makes it possible to carry out efficient oxidation. Further, since water vapor $H_2O$ intensely absorbs a vacuum ultraviolet light, it is mixed with an inert gas in a proper amount ratio so that the substrate surface is irradiated with an ultraviolet light beam.

In the present invention, the above ultraviolet light source can be selected from a xenon excimer lamp (emitted-light wavelength 172 nm), a krypton excimer lamp (emitted-light wavelength 146 nm), an argon excimer lamp (emitted-light wavelength 126 nm) or a fluorine excimer lamp (emitted-light wavelength 157 nm). Further, the above light source may be an excimer lamp using, as an exciting source, any one of dielectric barrier discharge, high-frequency discharge, microwave and electron beam.

In the present invention, further, the above inert gas inflow structure preferably has a constitution comprising a gas passage extending in a direction along the ultraviolet light source; and inert gas supply source for supplying the gas passage with the inert gas; and one or a plurality of discharge ports which communicate with the gas passage and are disposed along the gas passage and which are for discharging into the space the inert gas introduced into the gas passage.

In the above case, preferably, the gas passage and the one or a plurality of the discharge ports are provided on both sides of an irradiation range of the ultraviolet light beam from the ultraviolet light source. The gas passage and the one or plurality of the discharge ports can be formed in a box of the ultraviolet light source or can be formed in a tube placed between the ultraviolet light source and the bed.

Further, preferably, the interval, the size or the form of the one or a plurality of the discharge ports in the inert gas inflow structure are adjusted such that the discharge rate of the inert gas from a plurality of the discharge ports is nearly constant per unit length in the direction along the gas passage.

Further, the apparatus of the present invention may have a constitution comprising a rotary device for rotating the bed such that the work on the bed moves in the irradiation range of the ultraviolet light beam from the ultraviolet light irradiation light source or a moving device for moving the bed such that the work on the bed crosses the irradiation range of the ultraviolet light beam from the ultraviolet light irradiation light source.

The present invention is also concerned with a method of irradiation with an ultraviolet light beam for irradiating the surface of a work with the ultraviolet light beam to treat the surface. The method of the present invention comprises the steps of supporting the work in an atmosphere; allowing an inert gas to flow into a space in the atmosphere on and above the surface of the work; and irradiating the surface of the work with the ultraviolet light beam having a wavelength of 175 nm or shorter.

In the above method, preferably, the insert gas is mixed with water vapor and the mixture is allowed to flow into the space.

BRIEF DESCRIPTION OF DRAWING

FIGS. 1(A)–(C) show schematic diagrams of constitutions of an ultraviolet light beam irradiating apparatus in one example of the present invention.

FIG. 2 is a flow chart showing the procedures for cleaning or modification of a work.

FIGS. 3(A)–(C) show schematic diagrams of constitutions of an ultraviolet light beam irradiating apparatus in another example of the present invention.

FIGS. 4(A)–(C) show diagrams of other setting embodiments of a blow tube.

FIGS. 5(A) and (B) show diagrams of embodiments of outer form of a blow tube.

FIGS. 6(A)–(C) show diagrams of embodiments of layout of a gas feed port.

FIGS. 7(A)–(C) show diagrams of embodiments of form of a gas passage.

FIGS. 8(A) and (B) show diagrams of embodiments of another constitution of the blow tube.

FIGS. 9(A)–(F) show diagrams of embodiments of constitution of a nozzle.

FIGS. 10(A)–(E) show diagrams of embodiments when the inert gas discharge port is formed as a slit.

FIG. 11 shows a diagram of one embodiment of a device for mixing an inert gas with water vapor and feeding the mixture.

FIG. 12 shows a graph of contact angles when a nitrogen gas is introduced according to the present invention or not introduced.

PREFERRED EMBODIMENTS

The present invention will be explained in detail with reference to Working Examples hereinafter. FIG. 1 shows a schematic constitution of an ultraviolet light beam irradiating apparatus in one Working Example of the present invention. An ultraviolet light beam irradiating apparatus 10 of this Working Example has a lamp housing 12 having a xenon excimer lamp 11 as a vacuum ultraviolet light source, a table 13 for holding a work T and a motor stage 14 for rotating the table 13 with the work held on it. The work T to be cleaned or modified by means of the ultraviolet light beam irradiating apparatus 10 includes, for example, a silicon wafer substrate for producing an integrated circuit, a compound semiconductor silicon wafer substrate of gallium arsenide for producing a laser diode or LED, and a glass substrate for producing a flat panel display such as a glass substrate for producing a liquid crystal display or a plasma display panel. These substrates differ in state depending upon production steps and processes thereof, and they are in various states such as a state of exposed silicon or glass and a state where a film such as an oxide film, a resist, a color filter, a transparent conductive film, a metal film or the like is formed. The ultraviolet light beam irradiating apparatus 10 of the present invention can be used for cleaning or modifying the work surface in any one of these states.

The xenon excimer lamp 11 placed inside the lamp housing 12 has a constitution in which tubes made of a synthetic quartz glass are doubled, both ends are sealed and a space thereof is charged with a discharge gas 15 consisting mainly of xenon. A cooling medium 16 such as pure water is allowed to flow inside an inner tube for cooling. Metal electrodes 17 are attached to inner and outer surfaces of the dual tube while sandwiching each wall of synthetic quartz glass tubes with xenon gas (wavelength 172 nm) sealed therein. A voltage of 1 to 10 kV is applied between the two electrodes 17 from an electric power source 18, whereby plasma discharge is caused to excite gas inside, and light 19 having a wavelength characteristic of gas sealed therein is radiated. In practicing the present invention, the excimer lamp 11 may be replaced with an excimer lamp in which krypton (146 nm), argon (126 nm), argon (126 nm) or fluorine (157 nm) gas is charged in place of the above xenon gas. In addition to a dielectric barrier discharge excitation method in which a high voltage is applied, the excitation method includes high-frequency discharge excitation, microwave excitation and electron beam excitation methods.

The inside of the lamp housing is substituted with a nitrogen gas 20 which is an inert gas for efficiently leading a vacuum ultraviolet light beam radiated from the xenon excimer lamp 11 to an outside. The substitution of an inert gas is for preventing the attenuation of a vacuum ultraviolet light beam caused by oxygen. In practicing the present invention, the nitrogen gas may be replaced with an inert gas such as helium, argon or neon.

The above lamp housing 12 is provided with a synthetic quartz glass 21 attached thereto as a window material, for confining the above inert gas inside and for leading a light beam radiated from the xenon excimer lamp 11. The ultraviolet light beam from the xenon excimer lamp 11 is transmitted through the above synthetic quartz glass 21, and the work T is irradiated therewith. When an excimer lamp which radiates the ultraviolet light beam having a shorter wavelength than that of a light beam from the xenon excimer lamp 11 is used, calcium fluoride, magnesium fluoride, lithium fluoride or sapphire can be used as the above window material.

The above lamp housing 12 is provided with a reflection mirror 21 on an inner wall surface in the space in which the xenon excimer lamp 11 is placed. The reflection mirror 21 reflects the ultraviolet light beam from the xenon excimer lamp 11 and efficiently leads the reflected light beam toward the above synthetic quartz glass 21 side. In one embodiment, the reflection mirror 21 is made of aluminum which is polished for increasing a reflectance. Further, preferably, the reflection mirror 21 is surface-coated with a fluoride such as magnesium fluoride for preventing aged deterioration of the reflectance and corrosion.

The above table 13 for holding the work T is supported on the motor stage 14 and is horizontally rotated with it. The above horizontal rotation serves to uniformly irradiate the entire surface region of the work T with an ultraviolet light beam. That is, in the intensity distribution of a light beam from the xenon excimer lamp 11, the intensity is the highest immediately under it and decreases as the distance therefrom increases. Therefore, the above rotation allows the surface of the work T to pass immediately below the xenon excimer lamp 11, whereby the uniform irradiation of the surface with the ultraviolet light beam is realized. The above structure is the most effective for cleaning or modifying a disc-shaped work such as a semiconductor silicon wafer. However, it is naturally apparent to one of ordinary skill in the art that the present invention also has an effect when the work T is fixed in the ultraviolet light irradiation range without being rotated.

The work T is manually mounted on the table 13 or mounted thereon with a robot hand. The table 13 can hold the work T by fixing the work T thereto with a projection or other guide or with vacuum suction so that the work T does not cause positional deviation or fall down during the above rotation. For increasing the efficiency of cleaning or modification, preferably, the gap between the surface of the work T placed on the table 13 and the lower surface of the lamp housing 12 is smaller. In one embodiment, this distance is 3 to 5 mm.

The ultraviolet light beam irradiating apparatus 10 of this working Example is further provided with an inert gas inflow means 22 on both sides of the lamp housing 12. The inert gas inflow means 22 has a constitution comprising a gas supply source not shown in the drawing, a gas passage 23 and nozzles 24 as gas discharge ports. The lamp housing 12 has flange portions 12a on both side in the longitudinal direction, and the above gas passage 23 and the nozzles 24 are formed therein. As shown in FIG. 1(C), the gas passage 23 is formed along the above flange portion 12a, i.e., along the xenon excimer lamp 11, and the nozzles 24 are formed below it at regular intervals. The inert gas supplied from the gas supply source is fed into the gas passage 23 through a gas feed port 25 formed on one side of the gas passage 23, and ejected toward the surface of the work T through the gas passage 23 and through each nozzle 24. Part of the ejected inert gas flows into the irradiation range S of the ultraviolet light beam from the above xenon excimer lamp 11, to decrease the oxygen concentration in the atmosphere space. The decrease in the oxygen concentration in the space decreases the absorption of the ultraviolet light beam and improves the efficiency of cleaning and modification as is already described. For constant cleaning or modification, it is required to stabilize the rate of the inert gas ejected from the nozzle 24. For this purpose, in a preferred embodiment, the inert gas from the gas supply source is supplied through the above gas feed port 25 in a state where it is rate-controlled with a mass flow controller, or the like. In the present invention, the inert gas ejectable through the above nozzles includes, for example, nitrogen gas, helium gas and argon gas. In a preferred embodiment, further, the inert gas is mixed with water vapor and the mixture is fed on the surface of the work. The method of mixing the inert gas with water vapor will be discussed later.

The procedures for cleaning or modifying the work T in the above-constituted ultraviolet light beam irradiating apparatus 10 will be explained below. FIG. 2 is a flow chart showing the procedures for cleaning or modifying the work. In an initial step 201, the work T is placed on the table 13 manually or with a robot, and fixed with an arbitrary fixing means (e.g., vacuum suction). The ultraviolet light beam irradiating apparatus 10 can be designed to have a constitution in which the lamp housing 12 can be moved upwardly from the table 13 for making it easy to place the work T on the table 13. Then, the motor in the motor stage 14 is driven to rotate the work T at a predetermined number of rotations (step 202). In a preferred embodiment, the number of rotations is 10 to 60 rpm.

Simultaneously with, or immediately after, the initiation of the rotation of the above work T, the inflow of the inert gas by the above inert gas inflow means 22 is initiated (step 203). The valve of the gas supply source is opened, and the inert gas is introduced into the gas passage 23 and ejected through each nozzle 24. Part of the ejected inert gas flows into an ultraviolet light irradiation region S to fill the atmosphere thereof with the inert gas. When the rotation of the above work T is stabilized and when the inert gas sufficiently flows into the ultraviolet light irradiation region S, the xenon excimer lamp 11 is switched on to irradiate the surface of the work T with a vacuum ultraviolet light beam (step 204). The rotation of the above work T, the ejection of the inert gas and the irradiation with a vacuum ultraviolet light beam are continued for a predetermined period of time, whereby the cleaning or modification is completed.

The ultraviolet light beam irradiating apparatus in other Working Example of the present invention will be explained below. FIG. 3 shows a schematic constitution of the ultraviolet light beam irradiating apparatus in the "other Working Example" of the present invention. In an ultraviolet light beam irradiating apparatus 30 of this Working Example, differing from the inert gas inflow means in the above Working Example, an inert gas inflow means 33 has a constitution comprising a pair of blow tubes 34 and 34 provided separately from a lamp housing 32. The blow tubes 34 and 34 are fixed along a xenon excimer lamp 31 on both sides of the lower surface of the lamp housing 32. The length of each blow tube 34 is determined to be nearly equivalent to the light emission length of the xenon excimer lamp 31 or while taking into account the size of the work to be irradiated. As shown in FIGS. 3(B) and 3(C), each blow tube 34 has a gas passage 35 inside and has nozzles 36 made at constant intervals on their lower surface side. The inert gas from a gas supply source which is not shown is introduced from gas feed ports 37 formed in one end of each blow tube 34 into the gas passage 35 and ejected through each nozzle 36. The advantage of the ultraviolet light beam irradiating apparatus 30 of this Working Example is that the above inert gas inflow means 33 is easily attached and replaced. For adjusting the ejection rate and ejection range of the inert gas, the blow tubes 34 can be replaced. Further, the inert gas inflow means can be attached to an existing ultraviolet light beam irradiating apparatus having no inert gas inflow means.

In one preferred embodiment, each blow tube 34 has an inner diameter of 6 mm and an outer diameter of 8 mm and is made of stainless steel. Further, each nozzle 36 has a diameter D of 1 mm and a pitch P of 10 mm. Naturally, the material for the blow tubes 34 can be also selected from metals other than stainless steel, glass, ceramic and plastic.

In the ultraviolet light beam irradiating apparatus 30 of this Working Example, a motor stage thereof has a driving unit and mechanism for horizontally moving a table 39. In place of rotating the work T as described above, a motor stage 38 works to horizontally move the table with the work T on it so that the work T passes through an ultraviolet light irradiation region S in the cleaning or modification treatment. The thus-structured ultraviolet light beam irradiating apparatus is suitable for treating a relatively large-size work having a work surface larger than the ultraviolet light irradiation region S, such as a glass substrate for producing a liquid crystal display.

FIGS. 4(A) to 4(C) show setting modes of the above blow tubes 34. In the same drawings 4(A)a and 4(B), the nozzles 36 of the two blow tubes 34 are allowed to face the ultraviolet light irradiation region S at 45 degrees or 90 degrees, whereby an inert gas ejected from the nozzles 36 are easily focused on the ultraviolet light irradiation region S. In addition, the angle of the blow tubes 34 can be set as required, whereby the ejection angle of the inert gas can be properly selected. As shown in the same drawing 4(C), the above blow tubes 34 can be attached to an ultraviolet light beam irradiating apparatus capable of cleaning or modifying both the surfaces of the work T at the same time.

FIGS. 5 to 10 show embodiments of various constitutions of the above blow tube 34. Naturally, these embodiments can be employed in the inert gas inflow means 22 in Working Example shown in FIG. 1.

FIGS. 5(A) and 5(B) show embodiments of outer form of the blow tube 34. The same drawing 5(A) shows a cylindrical form, and the same drawing 5(B) shows a bar-shaped form. Further, the form of the blow tube 34 can be planiform or heteromorphic in cross section. FIGS. 6(A) to 6(C) show embodiments of layout of the gas feed port 37. The same drawing 6(A) shows an embodiment in which the gas feed port 37 is formed in one end of the gas passage 35, the same drawing 6(B) shows an embodiment in which it is formed in the center of the gas passage 35, and the same drawing 6(C) shows an embodiment in which the gas feed ports 37 are formed in both ends of the gas passage 35.

FIG. 7 shows embodiments of the form of the gas passage 35. The diameter of the gas passage 35 is varied depending upon the position of the above gas feed port 37, so that the amount of the inert gas ejected through each nozzle 36 is adjusted such that the amount is uniform. That is, in each embodiment, the gas passage 35 is formed such that the diameter thereof increases with an increase in the distance from the position where the gas feed port 37 is formed.

FIG. 8 shows an embodiment of other constitution of the blow tube. A block-shaped blow tube 80 shown in the same drawing 8(A) may be used in place of the above long blow tube 34. For broadening the ejection range of the inert gas, further, the inert gas inflow means may be constituted of a plurality of block-shaped blow tubes 80 as shown in the same drawing 8(B).

FIG. 9 shows embodiments of the constitution of the nozzle 36. The same drawing 9(A) shows an embodiment in which circular nozzles 36 are formed over the entire region of the blow tube 34 at constant intervals, the same drawing 9(B) shows an embodiment in which the nozzles 36 are concentrated in the central area of the blow tube 34, the same drawing 9(C) shows an embodiment in which the nozzles 36 are differently spaced from one another, the same drawing 9(D) shows an embodiment in which the nozzles 36 differ in diameter, the same drawing 9(E) shows an embodiment in which the nozzles 36 are formed only near ends of the blow tube 34, and the same drawing 9(F) shows an embodiment in which the nozzles 36 have the form of a rectangle.

In the above inert gas inflow means, the discharge port for the inert gas may have the form of a slit. FIG. 10 shows embodiments in which the above nozzles as the inert gas discharge ports are replaced with a slit 100. That is, the same drawing 10(A) shows an embodiment in which the slit 100 is formed nearly all over the entire region of the blow tube 34, the same drawing 10(B) shows an embodiment in which the slit 100 is formed only in the central area of the blow tube 34, the same drawing 10(C) shows an embodiment in which the slits 100 are formed on both end sides of the blow tube 34, the same drawing 10(D) shows an embodiment in which the slit 100 has a smaller width on a side where the gas feed port is formed and has a larger width on the other side, and the same drawing 10(E) shows an embodiment in which the slit 100 has a smaller width in the center where the gas feed port is formed and has larger widths on both the sides. The layout, the form, the number, etc., of the nozzles 36 and the slits 100 shown in FIGS. 9 and 10 can be selected and determined depending upon a necessary inert gas flow rate, an arrangement of the gas feed port, the form of the gas passage, and the like.

FIG. 11 shows one embodiment of a device for mixing the inert gas with water vapor and supplying the mixture. In the drawing, in an aerated bottle 112 made of glass in which pure water 111 is placed, a tube 113 for introducing the inert gas (e.g., nitrogen gas) is disposed so as to come near to a bottom of the aerated bottle 112, and a discharge tube 114 for leading generated water vapor to an outside is disposed in an upper portion of the aerated bottle 112. The pure water 111 in the aerated bottle 112 is heated at 50 to 90° C. with a hot plate 115. The inert gas from a gas cylinder which is not shown, as a supply source is flow-rate-controlled with a mass flow controller 116 and introduced into the aerated bottle 112. The pure water 111 in the aerated bottle 112 is bubbled, to generate water vapor. Inert gas and the generated water vapor are taken out from the discharge tube 114 of the aerated bottle 112, and these are introduced to the gas passage 35 from the above gas feed port 37 and discharged into the above ultraviolet light irradiation space S through the nozzles 36. Water vapor $H_2O$ irradiated with the vacuum ultraviolet light beam immediately generates $OH^-$ to oxidize organic substances on the surface of the work T or the surface of the work.

EXAMPLES

Silicon wafers having contaminated surfaces were cleaned with an ultraviolet light beam irradiating apparatus according to the constitution shown in FIG. 3, and comparisons were made with a case using a conventional ultraviolet light beam irradiating apparatus. The silicon wafers were allowed to stand in a non-clean room for 2 weeks to intentionally contaminate them before being used in the Example. Pure water was dropped on the contaminated silicon wafer surface and measured for a contact angle to show 32.6 degrees. The silicon wafer was placed on the horizontally movable table 39, and the distance between the silicon wafer surface and the lamp housing (to be referred to as "work distance" hereinafter) was set at 3 mm and 5 mm. The moving rate of the table 39 was varied between 4 mm/second and 50 mm/second. The vacuum ultraviolet light source 31 used was a xenon excimer lamp (wavelength 172 nm) based on a dielectric barrier discharge, and the lamp had a length of 350 mm.

Two blow tubes 34 having a length of 330 mm each were disposed in the lamp housing 32 having the lamp 31 inside. The blow tubes 34 had an inner diameter of 6 mm and an outer diameter of 8 mm, and nozzles 36 having an opening diameter of 1 mm each were made at intervals of 10 mm in the axial direction of the tubes. Each blow tube 34 had the gas feed port 37 in one end as shown in FIG. 3(B), and the other end was closed. The flow rate of nitrogen gas from a gas cylinder was set at 10 liters per minute with a mass flow controller. The gas was divided to two branches and connected to the gas feed ports 37 of the two blow tubes 34 with tubes.

Under the above conditions, the silicon wafer was irradiated with a vacuum ultraviolet light beam and the result was compared with the counterpart in an example in which the above nitrogen gas was not allowed to flow in. FIG. 12 shows the results as a graph. In the graph, the axis of abscissas shows the moving rate of the table, i.e., the moving rate of the silicon wafer, and the axis of ordinates shows the results of contact angle measurements after completion of the treatment.

Both when the work distance was 3 mm and when the work distance was 5 mm, the cleaning was finished earlier when nitrogen gas was allowed to flow. Generally, when the contact angle is 10 degrees or less, it can be decided that a surface is clean. The case where the work distance was 5 mm is taken up. When nitrogen gas was allowed to flow, the contact angle came to be 10 degrees at a rate of 15 mm/second. In contrast, it was when the rate was 10 mm/second that the contact angle came to be 10 degrees when the treatment was carried out without the flow of nitrogen gas.

The above silicon wafer as a work had a diameter of 300 mm, and it took 30 seconds to pass the above silicon wafer through a region below the lamp housing at a rate of 10 mm/second, and it took 20 seconds at a rate of 15 mm/second. These data show that the treatment could be carried out at a rate 1.5 times as high by allowing the nitrogen gas to flow. In this Example, the work had a size of 300 mm, and it is apparent that the above difference in the treatment time period comes to be outstanding as the size of the work increases. The present invention is very useful particularly when a glass substrate for producing a display having a large substrate size is irradiated.

Then, cleaning effects produced when nitrogen gas was allowed to flow and when nitrogen gas and water vapor were allowed to flow according to the present invention were compared with cleaning effects produced when neither gas nor water vapor was allowed to flow (conventional example), when oxygen gas which is not an inert gas was allowed to flow and when oxygen gas and water vapor were allowed to flow.

In this Example, irradiation with the ultraviolet light beam was carried out in a state where a silicon wafer stood still without moving it. The contact angle of the intentionally contaminated silicon wafer is about 40 degrees before the treatment. A xenon excimer lamp (wavelength 172 nm) was similarly used as a vacuum ultraviolet light source. The work distance was set at 3 mm. The silicon wafer was cut to a size of approximately 30×30 mm.

Mixed gases of nitrogen gas and water vapor and mixed gases of oxygen gas and water vapor were prepared with a device shown in FIG. 11. Pure water 111 was placed in the aerated bottle 112, and set at a temperature of 70° C. with the hot plate 115. Gas which was flow-rate-controlled with the mass flow controller was introduced into the aerated bottle 112 to generate water vapor. Treatment was carried out while varying the time period for irradiation treatment under the above conditions, and the silicon wafers were measured for contact angle. On the basis of irradiation results under each condition, a relationship of a contact angle to the irradiation time period was regressed to the following expression by a method of least squares.

$$C = C_0 \times \exp(-\alpha \cdot \text{time})$$

wherein $C_0$ is a contact angle before the treatment, time is an irradiation time period and C is a value of a contact angle measured after the treatment carried out for time seconds. The above $\alpha$ is a value determined by regressive calculation and is a coefficient expressing a cleaning rate. It means that with an increase in $\alpha$, the cleaning rate increases. Table 1 shows results of comparisons of values of $\alpha$ to the irradiation treatments under the above conditions.

TABLE 1

| Treatment method | Treatment efficiency α |
| --- | --- |
| Conventional example | 0.032 |
| (Nitrogen + water vapor) 5 l/min | 0.055 |
| (Nitrogen + water vapor) 10 l/min | 0.061 |
| (Nitrogen + water vapor) 20 l/min | 0.065 |
| (Nitrogen) 5 l/min | 0.041 |
| (Nitrogen) 10 l/min | 0.055 |
| (Nitrogen) 20 l/min | 0.050 |
| (Oxygen + water vapor) 5 l/min | 0.035 |
| (Oxygen + water vapor) 10 l/min | 0.032 |
| (Oxygen) 10 l/min | 0.020 |

The conditions under which $\alpha$ was the highest were observed when mixed gases of nitrogen gas and water vapor were allowed to flow at a rate of 20 liters per minute according to the present invention, and $\alpha=0.065$. When nitrogen gas was allowed to flow at a rate of 10 liters per minute according to the present invention, $\alpha=0.041$ or $\alpha$ was next highest. In contrast to these, in the conventional irradiation treatment, $\alpha=0.032$. Therefore, the rate 2 times as high was obtained by allowing mixed gases of water vapor and nitrogen to flow, and the rate 1.3 times as high was obtained by allowing nitrogen gas to flow.

When oxygen gas was allowed to flow, the efficiency was lower than that in the conventional example or as low as $\alpha=0.02$. It is assumed that the above was caused because the oxygen concentration on the silicon wafer increased so that the vacuum ultraviolet light beam did not easily reach the surface. Further, when mixed gases of oxygen and water vapor were allowed to flow, the result was nearly equivalent to the result from the treatment in the conventional example. It is assumed that the above is caused because the oxidation power of generated OH⁻ increased although the light intensity that reached the silicon wafer surface was small.

In the above experiments, it has been found that when the blow tube has a length L (mm) (a length of L/2 when the two blow tubes are used), the cleaning can be more efficiently carried out than in the conventional example by adjusting the flow rate of nitrogen gas to approximately L/60 (liter/minute).

Working Examples and Examples of the present invention have been explained with reference to the drawings. However, the present invention shall not be limited to particulars shown in Working Examples, and it is clear that the present invention can be altered or improved on the basis of descriptions of claims. The method of irradiation with an ultraviolet light beam according to the present invention can be used in combination with other known method of improving the effect of cleaning or modification. It is known that when the temperature of the work is increased, for example, to 100° C., the oxidation rate comes to be approximately 5 times as large. Therefore, mixed gases of water vapor and nitrogen are allowed to flow according to the present invention and the temperature of a work is increased, whereby the cleaning or modification can be carried out at a far higher rate.

The present invention is useful not only for the cleaning and modification of the surface of a work but also for direct oxidation of the surface of a substrate. For example, there is the step of forming a gate oxide film on a silicon wafer in semiconductor integrated circuits which are becoming finer and finer year-by-year, and a thermal oxidation method is used for the formation thereof. According to the present invention, however, mixed gases of water vapor and nitrogen gas are allowed to flow on the above substrate surface, whereby a good-quality oxide film can be formed on the silicon wafer at a lower temperature.

As described above, when the surface of a work is cleaned or modified by irradiation with an ultraviolet light beam, the treatment efficiency can be improved, and the time period required for the treatment can be decreased, according to the present invention.

According to the present invention, further, the treatment efficiency can be improved with a relatively simple apparatus constitution, the cost for the apparatus can be decreased, and mass-production thereof is eased.

What is claimed is:

1. An ultraviolet light beam irradiating apparatus for irradiating a surface of a work with an ultraviolet light beam to treat the surface, the apparatus comprising:
   a bed for supporting the work in atmosphere,
   an ultraviolet light irradiation light source for irradiating the surface of the work with the ultraviolet light beam having a wavelength of 175 nm or shorter, and
   an inert gas inflow means for allowing an inert gas to flow into a space in the atmosphere above the surface of the work, wherein the inert gas inflow means comprises:
- a gas passage extending along a longitudinal direction of the ultraviolet light irradiation light source,
- an inert gas supply source for supplying the gas passage with the inert gas, and
- a plurality of discharge ports which communicate with the gas passage and are formed along the longitudinal direction of the gas passage and which are for discharging the inert gas introduced into the gas passage into the space.

2. The ultraviolet light beam irradiating apparatus of claim 1, wherein said gas passage and said plurality of discharge ports are disposed on each side along the longitudinal direction of the ultraviolet light irradiation light source.

3. The ultraviolet light beam irradiating apparatus of claim 1, wherein said gas passage and said plurality of discharge ports are formed in a box for the ultraviolet light irradiation light source.

4. The ultraviolet light beam irradiating apparatus of claim 1, wherein said gas passage and said plurality of discharge ports are formed in a tubular material disposed between the ultraviolet light irradiation light source and the bed.

5. The ultraviolet light beam irradiating apparatus of claim 1, wherein said plurality of discharge ports in said inert gas inflow means have intervals, size or form adjusted to attain a nearly constant discharge rate of the inert gas from said plurality of discharge ports per unit length in a direction along the gas passage.

6. The ultraviolet light beam irradiating apparatus of claim 1, which has a rotary means for rotating the bed for moving the work on the bed in an irradiation range of the ultraviolet light beam from the ultraviolet light irradiation light source.

7. The ultraviolet light beam irradiating apparatus of claim 1, which has a moving means for straightly moving the bed for allowing the work on the bed to cross an irradiation range of the ultraviolet light beam from the ultraviolet light irradiation light source.

8. The ultraviolet light beam irradiating apparatus of claim 1, wherein said inert gas is mixed with water vapor, and a mixture formed is allowed to flow into the space.

9. The ultraviolet light beam irradiating apparatus of claim 1, wherein the inert gas is one of nitrogen, helium and argon.

10. The ultraviolet light beam irradiating apparatus of claim 1, wherein said ultraviolet light irradiation light source is one of a xenon excimer lamp, a krypton excimer lamp, an argon excimer lamp and a fluorine excimer lamp.

11. The ultraviolet light beam irradiating apparatus of claim 1, wherein said ultraviolet light irradiation light source is an excimer lamp using, as an exciting source, one of dielectric barrier discharge, high-frequency discharge, microwave or electron beam.

12. The ultraviolet light beam irradiating apparatus of claim 2, wherein said gas passage and said plurality of discharge ports are formed in a box for the ultraviolet light irradiation light source.

13. The ultraviolet light beam irradiating apparatus of claim 2, wherein said gas passage and said plurality of discharge ports are formed in a tubular material disposed between the ultraviolet light irradiation light source and the bed.

14. The ultraviolet light beam irradiating apparatus of claim 2, wherein said plurality of discharge ports in said inert gas inflow means have intervals, size or form adjusted to attain a nearly constant discharge rate of the inert gas from said plurality of discharge ports per unit length in a direction along the gas passage.

15. The ultraviolet light beam irradiating apparatus of claim 3, wherein said plurality of discharge ports in said inert gas inflow means have intervals, size or form adjusted to attain a nearly constant discharge rate of the inert gas from said plurality of discharge ports per unit length in a direction along the gas passage.

16. The ultraviolet light beam irradiating apparatus of claim 4, wherein said plurality of discharge ports in said inert gas inflow means have intervals, size or form adjusted to attain a nearly constant discharge rate of the inert gas from said plurality of discharge ports per unit length in a direction along the gas passage.

17. The ultraviolet light beam irradiating apparatus of claim 2, which has a rotary means for rotating the bed for moving the work on the bed in an irradiation range of the ultraviolet light beam from the ultraviolet light irradiation light source.

18. The ultraviolet light beam irradiating apparatus of claim 3, which has a rotary means for rotating the bed for moving the work on the bed in an irradiation range of the ultraviolet light beam from the ultraviolet light irradiation light source.

19. The ultraviolet light beam irradiating apparatus of claim 4, which has a rotary means for rotating the bed for moving the work on the bed in an irradiation range of the ultraviolet light beam from the ultraviolet light irradiation light source.

20. The ultraviolet light beam irradiating apparatus of claim 5, which has a rotary means for rotating the bed for moving the work on the bed in an irradiation range of the ultraviolet light beam from the ultraviolet light irradiation light source.

* * * * *